(12) United States Patent
Johansson et al.

(10) Patent No.: US 6,222,141 B1
(45) Date of Patent: Apr. 24, 2001

(54) IRRADIATION CONTROLLED SWITCH

(75) Inventors: Erik Johansson; Per Skytt, both of VästerÅs (SE)

(73) Assignee: Asea Brown Boveri AB, Vasteras (SE)

( * ) Notice: Subject to any disclaimer, the term of this patent is extended or adjusted under 35 U.S.C. 154(b) by 0 days.

(21) Appl. No.: 09/223,977

(22) Filed: Dec. 31, 1998

(51) Int. Cl.[7] .................................................. H01J 40/14
(52) U.S. Cl. ............................................................ 200/61.02
(58) Field of Search .......................... 200/61.02, DIG. 36

(56) References Cited

U.S. PATENT DOCUMENTS

| | | |
|---|---|---|
| 4,633,286 | 12/1986 | Bovino . |
| 5,047,623 * | 9/1991 | Wilcox .............................. 250/211 R |
| 5,592,053 | 1/1997 | Fox et al. . |

FOREIGN PATENT DOCUMENTS 3140754    6/1983    (DE) .

* cited by examiner

*Primary Examiner*—Renee Luebke
(74) *Attorney, Agent, or Firm*—Connolly Bove Lodge & Hutz, LLP

(57) ABSTRACT

A switch comprises at least a first layer of a first material and two contact electrodes arranged on opposite sides of the first layer and connectable to different potentials for applying a voltage thereacross. A first layer is adapted to be conducting upon applying a voltage across the contact electrodes when exposed to irradiation through an irradiation source of an energy high enough for lifting charge carriers from the valence band to the conduction band of the first material. The contact electrode arranged on the first side of the first layer is laterally displaced with respect to the contact electrode arranged on the opposite second side of the layer with a lateral distance separating them.

17 Claims, 1 Drawing Sheet

IRRADIATION CONTROLLED SWITCH

TECHNICAL FIELD

The present invention relates to a switch comprising at least a first layer of a first material and two contact electrodes arranged on the first layer on opposite sides thereof and connectable to different potentials for applying a voltage thereacross. The first layer is to be conducting upon applying a voltage across the contact electrodes when exposed to irradiation through an irradiation source of an energy high enough for lifting charge carriers from the valence band to the conduction band of the first material.

BACKGROUND OF THE INVENTION

A switch of this type finds many applications, and it may for instance be used in equipment for handling high electric power for switching high voltages (which may be 2–400 kV) and currents, for example in surge diverters, currents limiters, and the like. An advantage of a switch of this type is that irradiation control provides for very fast switching, which is of particular importance in high power applications for protection of equipment when faults occur.

One problem with such switches is that some materials which might be candidates to be used as the first material will have a columnar-grain structure and will accordingly be polycrystalline, although a mono-crystalline structure is preferable. These columns will extend substantially vertically between the two sides of the first layer, and as the contact electrodes are applied on opposite sides of the first layer, the grain boundaries formed by the columns may act as potential short-circuit paths between the contact electrodes thereby substantially reducing the breakdown field of the switch and increasing the intensity of leakage currents. This problem is, for example, there for CVD diamond, which it is very difficult to grow mono-crystalline, and the risk is high that impurities, e.g. graphite, are gathered in the grain boundaries, so that the level of the voltage across the contact electrodes which the switch will be conducting in the blocking (open) state will be reduced considerably.

SUMMARY OF THE INVENTION

The object of the present invention is to provide a switch of the type defined in the introduction herein which is, in at least some aspect, improved with respect to switches of this already known type.

This object is, according to the invention, obtained by laterally displacing the contact electrode arranged on the first side of the first layer with respect to the contact electrode that is arranged on the opposite second side of the layer with a lateral distance separating them.

This means that the current paths from one contact to the other will have a lateral component, so that the current for materials with a columnar-grain structure will be transgranular, i.e. the grain boundaries will not act as short-circuit paths between the contacts. This will also contribute to the ability of the switch to hold higher voltages in the blocking (open) state thereof and increase the reliability of the switch. The arrangement of the contact electrodes laterally displaced in this way but arranged on opposite sides of the first layer, results in a solution to the problem of grain columns, if there, while still avoiding problems of field control for avoiding risks of flash-over which would result if the contact electrodes were arranged on the same side of the first layer for solving the problem associated with the columnar-grain structure. Furthermore, the lateral displacement of the contact electrodes with respect to each other results in a larger distance therebetween than in the case of no such displacement, which means a capability of such a switch to hold a higher voltage in the blocking state thereof for a given thickness of the first layer.

According to a preferred embodiment of the invention the shortest lateral distance between the two contact electrodes is substantial, which advantageously ensures that a current will be trans-granular for a material with a columnar-grain structure.

According to another preferred embodiment of the invention, the irradiation source is adapted to irradiate the first layer from opposite directions on the first as well as second sides. The fact that the contact electrodes are laterally displaced with respect to each other means that there have to be surfaces on both sides of the first layer not covered by any portions of the respective contact electrode. This which means that they will be reached by the irradiation without the necessity to irradiate through the contact electrode, which is a condition for using light for the irradiation. Furthermore, thanks to the lateral displacement of the contact electrodes, it will in this way be possible to irradiate all the surfaces of the first layer, thereby forming interfaces to the respective contact electrode through the irradiation from the opposite side of the first layer, so that a lower overall resistance of the switch is obtained. This will result from, among other things, a reduction of the contact barrier as a consequence of the illumination of the contacts.

According to another preferred embodiment of the invention the irradiation source is adapted to apply light on the first layer. The particular advantages of the switch according to the invention in connection with the use of light for irradiation appear from the previous paragraph. Furthermore, light is preferred for irradiation, since it may penetrate deeply into the first layer without causing any damage, and the first layer may therefore by made rather thick when light is used for controlling the switch, so that the switch may hold a high voltage in the blocking (open) state thereof.

According to another preferred embodiment of the invention, the irradiation source is adapted to irradiate the first layer by accelerated electrons. In such a case, it is not necessary to irradiate the first layer from both sides, since the electrons are able to penetrate the contact electrodes and will therefore reach the interface between the contact electrode and the first layer also on the side irradiated.

According to another preferred embodiment of the invention, each contact electrode has a plurality of contact portions arranged with lateral spacings, and according to further preferred developments of this embodiment each contact electrode has, as seen from the vertical direction, a fork-like shape with teeth of each fork arranged in the space between adjacent fork teeth of the contact electrode. Alternatively, each contact electrode has ring-like contact portions being substantially concentrically applied on the first layer with lateral spacings, the ring-like portions of each contact electrode being arranged in a radial space between two adjacent ring-like portions of the other contact electrode as seen from the vertical direction. These are preferred ways of obtaining the current paths with lateral components and a possibility to use light for irradiation and still reach all interfaces between the contact electrodes and the first layer. These structures also involve the possibility to maintain a comparatively large active area, i.e. the area which may be reached by charge carriers in the conducting state of the switch, of the contact electrodes, so that the contact resistance contribution to the total resistance of the switch may be kept at a low level.

According to another preferred embodiment of the invention the first layer is made of an intrinsic material, and the switch is adapted to be conducting when the first layer is irradiated and a voltage is applied across the contact electrodes thereof irrespectively of the direction of the voltage and in a blocking state when no irradiation of the first layer takes place, in which it is advantageous to use a wide bandgap material as the first material, i.e. a material having an energy gap between the valence band and the conduction band thereof of at least 2,5 eV, since this means that the switch will be able to hold very high voltages in the blocking state thereof. It is particularly interesting to use diamond as such material of the first layer thanks to the large energy gap between the valence band and the conduction band in diamond (5,4 eV), and diamond may here also well be used in spite of the columnar-grain structure hard to avoid in diamond thanks to a mutual lateral spacing of the two contact electrodes.

Further advantages and advantageous features of the invention will appear from the following description and the other dependent claims.

BRIEF DESCRIPTION OF THE DRAWING

With reference to the appended drawing, below follows a specific description of preferred embodiments of the invention cited as examples.

In the drawing.

DETAILED DESCRIPTION OF PREFERRED EMBODIMENTS

Figure 1:
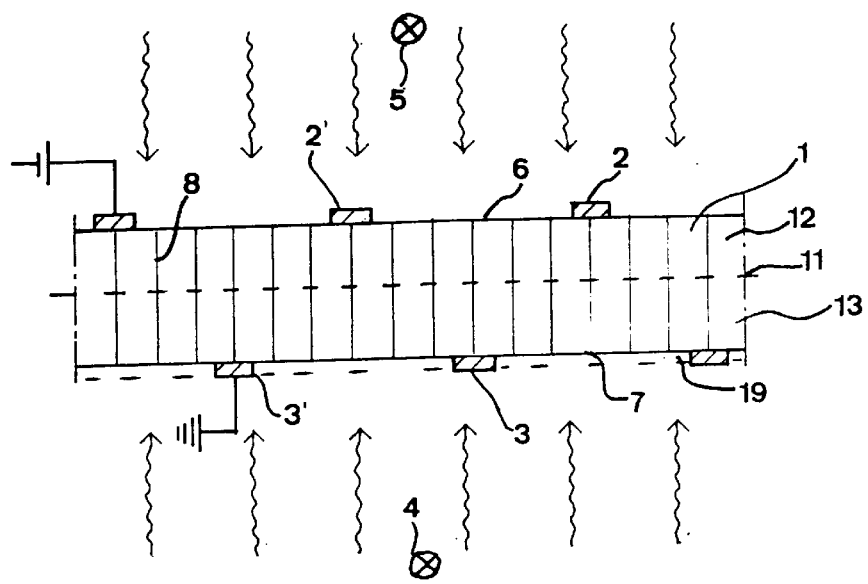
FIG. 1 is a schematic cross-section view of an irradiation-controlled switch according to a first preferred embodiment of the invention.

A switch according to a preferred embodiment of the invention is very schematically shown in FIG. 1, and this switch has a first layer 1, which in this case is made of intrinsic diamond, and typically may have a thickness of about 200 μm, and two contact electrodes 2, 3. The contact electrodes are connectable to different potentials for applying a voltage across the first layer between these electrodes. Accordingly, the two contact electrodes are adapted to be connected to, for example, an electric circuit of an apparatus for controlling a power network.

The switch also comprises an irradiation source 4, 5, which in this case is adapted to irradiate the first layer from a first side 6, as well as the opposite, second side 7 thereof. In this case, the first layer is illuminated by ultraviolet light (UV) of an energy exceeding the energy gap between the valence band and the conduction band of the material of the first layer, i.e. diamond, which in fact has a gap of approximately 5,4 eV. The irradiation source will in this way, lift charge carriers of the diamond layer from the valence band to the conduction band thereof, so that the switch will be conducting upon applying of a voltage thereacross as long as the irradiation is carried out, irrespectively of the direction of such voltage.

Figure 2:
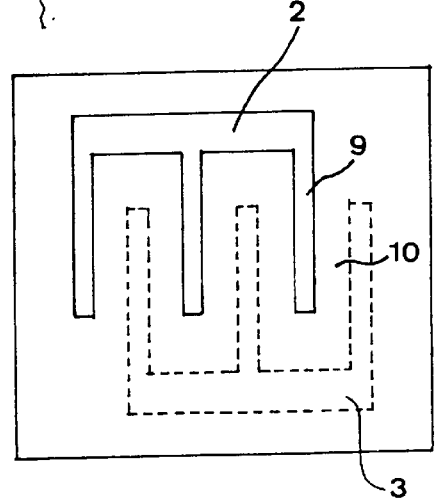
FIG. 2 is a very schematic view from above of the switch in FIG. 1.

Furthermore, it is very simply illustrated how the first layer has a columnar-grain structure and is accordingly polycrystalline, with the columns 8 extending between the two sides 6, 7 of the first layer. This will normally mean that the columns may act as short-circuit paths between the contact electrodes substantially reducing the breakdown field of the switch and increasing the intensity of leakage currents. However, the present invention finds a remedy for this inconvenience by arranging the two contact electrodes laterally displaced with respect to each other with a lateral distance separating them, which appears both from FIG. 1 and 2. It appears from FIG. 2 that this is achieved by designing each contact electrode as seen from the vertical direction as a fork with the teeth 9 of each fork arranged in the space 10 between adjacent fork teeth of the other contact electrode. Accordingly, the current between the two electrodes has to be trans-granualar, so that no short-circuit paths may be created by the grain boundaries of the columns. Furthermore, this lateral displacement also means that the interfaces between each contact electrode portion and the first layer may all be reached by light when irradiated from the two opposite directions, since one contact electrode will not form any shadow for the other contact electrode, which results in a lower contact resistance of the switch. This also means that there is no need of making any of the contact electrodes with a small surface for enabling an irradiation of the entire first layer for creating free charge carriers therein, but this will always be ensured thanks to the lateral displacement of the contact electrodes, so that the on-state characteristics of the switch may be improved.

Additionally, the lateral distance between contact portions, such as 2' and 3' in FIG. 1 of the two contact electrodes may be varied independently of the thickness of the first layer 1 for varying the breakdown field of the switch, and a switch with an optimum combination of on-state and blocking state characteristics for a given application, may in this way be constructed.

FIG. 1 by dashed line 11 schematically illustrates how the first layer may also be made of two sub-layers 12, 13 of semiconductor materials, for instance diamond, SiC or Si, being doped according to opposite conductivity types, p and n, for forming a rectifying diode, which will always be conducting when the pn-junction 11 is forward biased, and blocking when the pn-junction is reverse biased and the first layer is not irradiated by the source 4, 5 but conducting when the first layer is irradiated.

Figure 3:
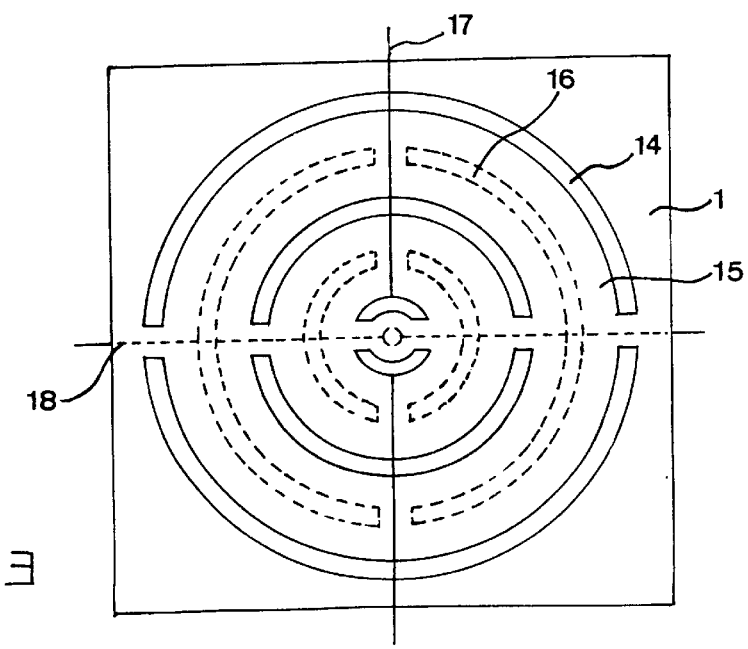
FIG. 3 is a view corresponding to FIG. 2 of a switch according to a second preferred embodiment of the invention.

A switch according to a second preferred embodiment of the invention is shown in FIG. 3, and in this switch each contact electrode has ring-like contact portions 14 substantially concentrically applied on the first layer with lateral spacings 15, and the ring-like portions of each contact electrode are arranged in a radial space 16 between two adjacent ring-like portions of the other contact electrode as seen from the vertical direction. The lines interconnecting all contact portions belonging to the same contact electrode are indicated by 17 and 18.

The invention is, of course, not in any way restricted to the preferred embodiments described above, but many possibilities to modifications thereof would be apparent to one with ordinary skill in the art without departing from the basic idea of the invention.

The first layer may be of any other material and is not at all restricted to those mentioned above. Especially wide band gap materials as GaN, AlN and BN constitute advantageous options.

The irradiation may take place from only one side, especially when electrons are used. However, it is also possible to use light for the irradiation and only irradiate to the first layer from one side and then arrange mirrors between the contact electrode portions on the other side for reflecting light inciding thereon back towards the portions of the first layer on which the contact electrode has thrown a shadow. A second layer 19 for such a reflection is indicated in FIG. 1 by dashed lines, but it will accordingly not be there when irradiation takes place from both sides.

The claim definition "crystalline materials" includes mono- as well as polycrystalline materials.

We claim:

1. A switch comprising: a single layer of a first material and two contact electrodes arranged on opposite sides of said layer, the contact electrodes being connectable to different potentials for applying a voltage thereacross, said layer conducting upon application of a voltage across said contact electrodes when exposed to irradiation through an irradiation source of an energy high enough for lifting charge carriers from the valence band to the conduction band of said first material, wherein a first contact electrode arranged on a first side of the layer is laterally displaced with respect to a second contact electrode arranged on the opposite second side of the layer with a lateral distance separating them, the shortest lateral distance between adjacent contact electrodes located on opposite sides of the layer being so large that the current path between the two contact electrodes will have a lateral component.

2. A switch according to claim 1, wherein said irradiation source irradiates said layer from opposite directions on said first and said second side.

3. A switch according to claim 1, wherein said irradiation source is light applied on said layer.

4. A switch according to claim 1, wherein said irradiation source irradiates said layer by accelerated electrons.

5. A switch according to claim 1, wherein each contact electrode has a plurality of contact portions arranged with lateral spacings.

6. A switch according to claim 5, wherein each contact electrode has, as seen from a vertical direction, a fork-like shape with the teeth of each fork arranged in the space between adjacent fork teeth of the other contact electrode.

7. A switch according to claim 5, wherein each contact electrode has ring-like contact portions being concentrically applied on the layer with lateral spacings, and said ring-like portions of each contact electrode are arranged in a radial space between two adjacent ring-like portions of the other contact electrode as seen from a vertical direction.

8. A switch according to claim 1, wherein said layer is made of a crystalline material.

9. A switch according to claim 1, wherein first layer is made of an intrinsic material, and the switch is conducting when the layer is irradiated and a voltage is applied across the contact electrodes thereof irrespective of the direction of said voltage and is in a blocking state when no irradiation of the layer takes place.

10. A switch according to claim 1, wherein said first material of first layer is a wide band gap material having an energy gap between the valence band and the conduction band thereof of at least 2.5 eV.

11. A switch according to claim 10, wherein said material of the layer is one of SiC, GaN, AlN and BN.

12. A switch according to claim 10, wherein said material of the layer is diamond.

13. A switch according to claim 12, wherein said diamond is doped.

14. A switch according to claim 1, wherein said layer is made of Si.

15. A switch according to claim 1, wherein said layer is made of at least two superimposed sub-layers of a semiconductor material being doped according to opposite conductivity types, n and p, for forming a rectifying diode, which diode will always be conducting when the pn-junction is forward biased and will be blocking when the pn-junction is reverse biased and said layer is not irradiated through the irradiation source but conducting when said layer is irradiated therethrough.

16. A use of a switch according to claim 1 for switching high powers and/or high voltages and/or high currents.

17. A use of a switch according to claim 16 in a device for protection of equipment for electric power applications.

* * * * *